(12) United States Patent
Hartl

(10) Patent No.: US 8,732,649 B2
(45) Date of Patent: May 20, 2014

(54) BACKWARD ANALYSIS FOR DETERMINING FAULT MASKING FACTORS

(75) Inventor: Robert Hartl, Ismaning (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 13/582,315

(22) PCT Filed: Feb. 8, 2011

(86) PCT No.: PCT/EP2011/051786
§ 371 (c)(1),
(2), (4) Date: Nov. 14, 2012

(87) PCT Pub. No.: WO2011/107321
PCT Pub. Date: Sep. 9, 2011

(65) Prior Publication Data
US 2013/0061104 A1 Mar. 7, 2013

(30) Foreign Application Priority Data

Mar. 4, 2010 (DE) .......................... 10 2010 002 563
Aug. 31, 2010 (DE) .......................... 10 2010 040 035

(51) Int. Cl.
*G06F 17/50* (2006.01)
(52) U.S. Cl.
USPC ........... 716/136; 716/108; 716/115; 716/134; 703/13; 703/14; 327/166; 327/176
(58) Field of Classification Search
USPC .............. 716/136, 108, 115, 134; 703/13–14; 327/166, 176
See application file for complete search history.

(56) References Cited

U.S. PATENT DOCUMENTS

| 6,401,227 | B1  |   | 6/2002  | Yasue et al. |
|-----------|-----|---|---------|---------------------------|
| 7,159,199 | B2  | * | 1/2007  | Warren .................... 716/108 |
| 7,296,201 | B2  | * | 11/2007 | Abramovici ............... 714/724 |
| 2004/0205680 | A1 | * | 10/2004 | Gyure et al. ................. 716/4 |
| 2005/0283950 | A1 |   | 12/2005 | Portelli |
| 2007/0226572 | A1 |   | 9/2007  | Zhang et al. |
| 2012/0210282 | A1 | * | 8/2012  | Iwashita .................... 716/108 |

FOREIGN PATENT DOCUMENTS

| JP | 61-187047 | 8/1986 |
| JP | 11-142482 | 5/1999 |

OTHER PUBLICATIONS

International Search Report, PCT International Application No. PCT/EP2011/051786, dated Apr. 20, 2011.
Choudhury et al., "Reliability Analysis of Logic Circuits," *IEEE Transactions on Computer Aided Design of Integrated Circuits and Systems*, IEEE, 2009.
Krishnamohan et al., "Slack Redistribution in Pipelined Circuits for Enhanced Soft-Error Rate Reduction," *SOC Conference*, 2008.

(Continued)

*Primary Examiner* — Nghia Doan
(74) *Attorney, Agent, or Firm* — Kenyon & Kenyon LLP

(57) ABSTRACT

A method and a system for determining the observability of faults in an electronic circuit include a processor that simulates, in a simulation phase, a behavior of the electronic circuit using a simulation model, and that determined, in an analysis phase, based on the simulation, and for each of a plurality of elements of the electronic circuit, time periods in which an occurrent fault could cause a deviation in analysis output signals, where the occurrent fault is determined not to cause any deviation in output signals in other time periods.

9 Claims, 5 Drawing Sheets

(56) References Cited

OTHER PUBLICATIONS

Menon et al., "SCRIPT: A Critical Path Tracing Algorithm for Synchronous Sequential Circuits," *IEEE Transactions on Computer-Aided Design*, IEEE, 1991.

Mukherjee et al., "A Systematic Methodology to Compute the Architectural Vulnerability Factors for a High-Performance Microprocessor," *Proceeding of the 36th Annual International Symposium on Microarchitecture (MICRO)*, 2003.

Nguyen et al., "Chip-level Soft Error Estimation Method," *IEEE Transactions on Device and Materials Reliability IEEE USA*, 2005.

Shaver et al., "Decoupled Control of Combustion Timing and Work Output in Residual-Affected HCCI Engines," *American Control Conference*, 2005.

\* cited by examiner

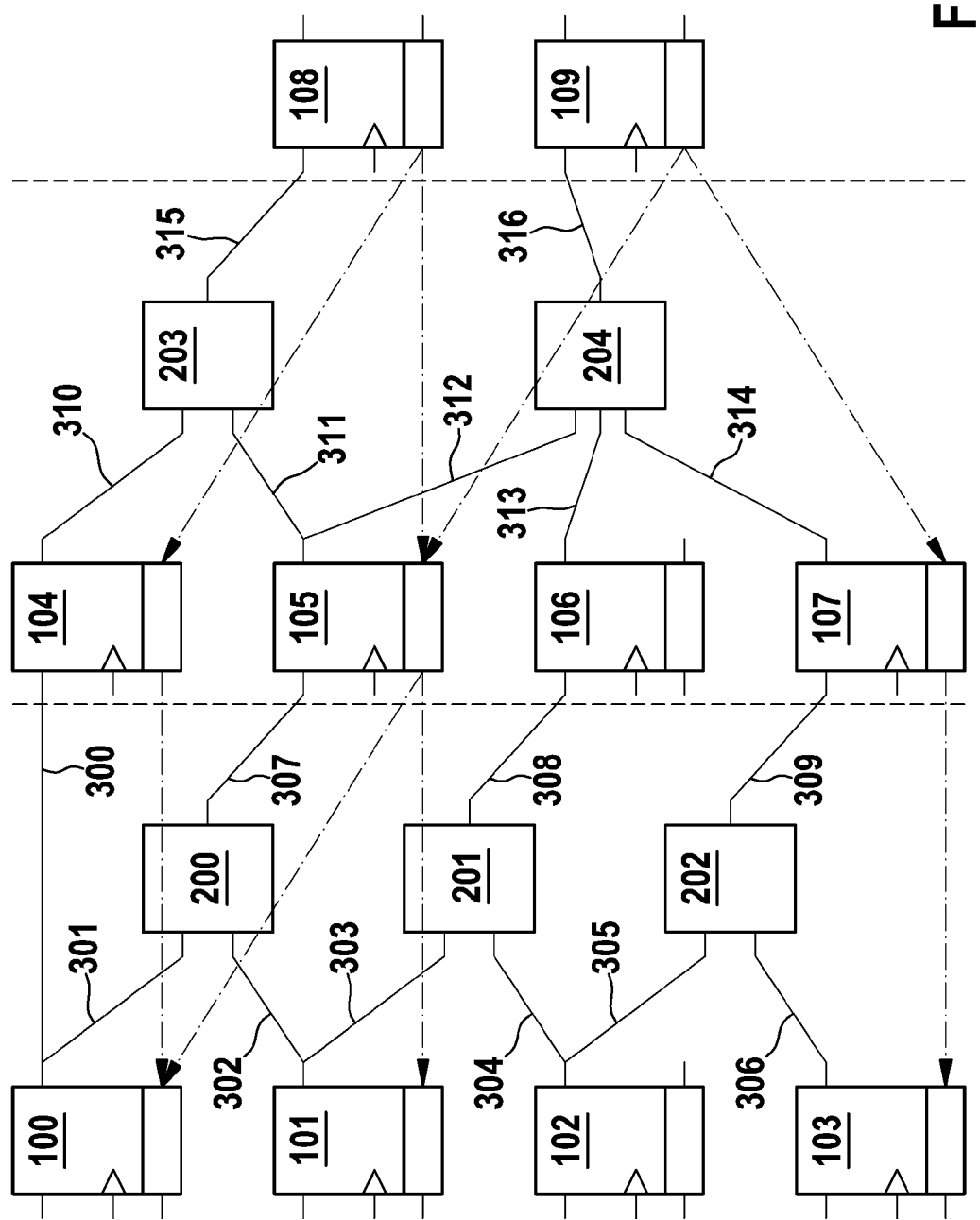

BACKWARD ANALYSIS FOR DETERMINING FAULT MASKING FACTORS

FIELD OF THE INVENTION

The present invention relates to a method for determining the observability of faults in an electronic circuit, and a system for carrying out the method.

BACKGROUND INFORMATION

Electronic circuits, in particular digital circuits having for example semiconductor components, are exposed to external influences that can cause undesired changes in their behavior. A correct, fault-free behavior of the circuit can be expected by the user when all operating parameters, such as operating voltage, temperature, mechanical load, etc., are within the specified limits. If one or more parameters are outside these limits, systematic faulty behavior may be observed.

However, faulty behavior can also be triggered by other external influences, such as electromagnetic radiation or high-energy particles such as cosmic radiation, radioactive decay products, etc. The frequency of occurrence of such radiation influence is a function in particular of the location at which the circuit is used (on the surface of the earth, elevation above sea level, vicinity to particular sources of radiation), and of the sensitivity of the circuit itself. Here it should be kept in mind that the sensitivity of the circuit generally increases strongly as the structural size of the circuit components decreases.

Occurring faults can be divided into two groups, namely permanent faults, which bring about a lasting change in the circuit and therefore a defect, and transient faults, which cause a temporary change in the state or behavior of the circuit.

Transient faults can in turn be divided into two groups:

Single-event transient (SET): brief disturbing impulse in the voltage level of a line;

Single-event upset (SEU): inversion or change in the state or of the information in the memory cells.

There are many scientific publications that deal with the fault masking of SEUs, in particular in microprocessors. Here, the term "Architectural Correct Execution" bit (ACE) is defined. ACE bits are all memory cells that have an effect on the system output in the case of a fault.

Alongside this, all bits that cannot influence the instruction path within the processor are designated "microarchitectural un-ACE" bits. These can occur in idle states, during speculative calculation, and in predictive structures (predictors). Frequently, values calculated there are not used, and therefore also have no effect (un-ACE).

As a third group, "architectural un-ACE" bits are defined, which do have an effect on the result of a single instruction, but have no effect on the system output. These can occur in the case of NOP (no operation) instructions, performance-increasing indications, such as prefetch, instructions with predicate register, logic-masking effects of the operands, and so-called dynamically dead instructions. Here there is a further distinction between "first-level dynamically dead instructions" (FDD), e.g., two write accesses to the same address without reading of the first value between the two accesses, and "transitively dynamically dead instructions" (TDD), which produce results that are used only by FDDs or TDDs.

Concerning the above, reference is made to the publication of Shubhendu S. Mukherjee, Christopher Weaver, Joel Emer, Stephen K. Reinhart, Todd Austin: "A Systematic Methodology to Compute the Architectural Vulnerability Factors for a High-Performance Microprocessor," IEEE, 2003.

Combinatorial digital circuits are distinguished by their deterministic behavior. This has the consequence that with a given digital logic function and given input values, the output value can be unambiguously determined. If a transient fault occurs in one or more input signals to a logic function with an output (1 bit), a faulty output signal may occur, as a function of the input signals and the logic function. Whether a particular fault causes a deviation from the expected behavior of the circuit at one of the outputs, i.e., the fault becomes visible, is referred to as observability, or fault observability. Here it is to be noted that not every fault becomes visible as a faulty output; this is referred to as masking, or fault masking.

The sensitivity of a specific combination of input signals relative to a specific fault can be determined using the Boolean difference. If the Boolean difference for a function input is equal to 1, a change in this input signal will cause a change in the output signal. In general, one speaks of a sensitive path from an input to an output if a change in this one input signal causes a change in the output signal.

Boolean Function:

$$f(x_1, \ldots, x_n) \in \{0,1\}, x_i \in \{0,1\}$$

Boolean Difference:

$$\frac{df}{dx_i} = f(x_1, \ldots, x_i, \ldots, x_n) \oplus f(x_i, \ldots, \overline{x}_i, \ldots, x_n)$$

The result of the Boolean difference for each input signal, the temporal portion of the occurrence of a specific input combination, and the probability of a fault of an individual signal, together enable the calculation of a fault probability or fault masking probability. In the case of a multistage logic, the results of the individual stages must be compensated using correlation.

Reference is made here to the publication of Ming Zhang, Naresh R. Shanbhag: A Soft Error Rate Analysis (SERA) Methodology, IEEE, 2004, US 2007/0226572 A1.

For sequential circuits (synchronous circuit technology), the time characteristic also plays a large role. Thus, in every larger circuit there are a large number of nodes that are not important for the functioning of the circuit at every point in time. Therefore, fault masking effects can also be observed over time. The properties of the circuit prevent a portion of the occurrent faults from being visible at the output. The ratio of visible faults to actually occurring faults is referred to as the derating factor.

In this thematic area, the following terms are used:

Timing Derating (TD):

Timing derating is an effect that arises due to the runtime of a signal from a register or latch to the next register or latch, i.e., during the running through of a stage, in a synchronous circuit design.

Due to the runtime of a signal through the logic gates and lines (logic path) between two storage elements (register or latch), faults (SEUs) that occur at the beginning, at a register or latch, of this logic path do not always reach the end of this path in a timely manner at the sampling time. In this case, this fault is also not propagated into the next stage of the circuit, but rather is masked out.

The excess time for the propagation of a signal within a synchronous circuit stage (clock period tClk−signal runtime through the logic path tDelay) is referred to as slack. All SEUs at the storage element at the beginning of the logic path that occur less than tDelay before the sampling time of the storage element at the end of the logic path have no effect on the value of the sampled signal. Therefore, the ratio of the slack to the clock period can be regarded as the timing derating factor.

Logic Derating (LD):

So-called logic derating is the reduction of visible faults in relation to the actual number of faults on the basis of the overall logical function of a circuit. Logic derating is a function both of the use of the circuit and of the architecture of the circuit itself. Whenever a register content is faulty, but its state is no longer further processed, one speaks of logic derating, and the information of the clock gating or from the branch prediction can be used in a processor. Here, the designations "soft error sensitivity factors" or "vulnerability factors" are also alternatively used.

Reference is made here to the publication of Hang T. Nguyen, Yoad Yagil, Norbert Seifert, Mike Reitsma: Chip-Level Error Estimation Method, IEEE, 2005.

If all masking effects under consideration are combined in a single factor, one speaks of an Architectural Vulnerability Factor (AVF). The probability that a fault of a particular component will influence the circuit output is calculated here from the base fault rate, which is dependent on the technology, multiplied by the AVF.

Reference is made here to the publication of Shubhendu S. Mukherjee, Christopher Weaver, Joel Emer, Stephen K. Reinhart, Todd Austin: "A Systematic Methodology to Compute the Architectural Vulnerability Factors for a High-Performance Microprocessor," IEEE, 2003.

In addition to analytical methods, using circuit simulation it is possible to determine an overall masking factor by feeding faults into the circuit. Here, the progression of all output signals of the circuit for a fixed set of input stimuli is stored. This is used as a reference for the fault-free operation of the circuit.

In fault injection, faulty values are introduced into the circuit in a stochastically distributed manner over the entire circuit and over the entire simulation time period. After the feeding of a single fault into the progression of a signal at a fault location, the simulation is regularly continued, and the output vector, namely the totality of all output signals, is observed for a predefined time period. Within this time period, the output vector is compared to the fault-free reference as a target value, and possible differences are noted. If there is at least one visible fault, this simulation run is evaluated as faulty. The connection of fault location and effect at the output is stored.

Fault injection must be carried out in the context of an entire campaign, i.e., many simulation runs using different faults. The results obtained in this way are now combined for each fault location. Per fault location, the number of simulation runs containing faults relative to the number of fed-in faults is examined. This ratio is the fault masking factor for a signal.

The determination of a masking factor through fault injection requires a very high computing expense, because in a simulation it is always possible to draw only one conclusion for a specific fault. The precision of the results due to fault injection is a function of the number of simulation runs, namely the number of injected faults. A high degree of statistical precision is achieved only beginning from a high number.

U.S. Application Publication No. US 2005/0283950 A1 describes a method for reducing faulty detection of faults in microprocessors through the tracing of so-called dynamically dead instructions. In this method, it is monitored whether a given instruction is a dynamically dead instruction. In this way, false positives can also be reduced.

In addition to faults that occur during circuit operation, manufacturing faults in the circuits must also be recognized. The recognition of circuit faults takes place, as a rule, through a test in the production facility, and possibly during, or at the beginning, of circuit operation, by applying defined test patterns. However, in the production of these test patterns it is often not yet known which faults are recognized using the test pattern set. The tracing of critical paths (Critical Path Tracing, CPT) in integrated circuits having combinatorial functioning has been carried out for many years to make it possible to determine the test coverage of a test pattern set. In CPT, using the Boolean difference sensitive paths are calculated, beginning from the primary outputs and going to the primary inputs. In this method, many scientific publications also take into account in particular the effects of reconvergent paths. In general, these paths are represented and analyzed by creating a reconvergence graph. By taking into account the specific structure and properties of the graph, the effects of self-masking and multiple-path stimulation can be taken into account. CPT yields as a result all sensitive paths of a circuit for a circuit state. A sensitive path means that all circuit nodes in this sensitive path are observable, i.e., a fault would become visible in the form of a deviating output signal. From this it can be inferred that the input signals of the circuit state currently being examined are a test vector for stuck-at faults of the opposed (negated) momentarily present digital signal level of all circuit nodes in all sensitive paths (e.g., signal level is logical 1 for test stuck-at 0, and vice versa). CPT can therefore be used for the fast parallel determination of the test coverage (fault grading) of combinatorial circuits. Through an expansion, CPT can also be used for sequential circuits; here, fault lists of possibly detectable faults are stored in sequential elements and propagated forward. The faults contained in these lists are not detectable until these fault lists reach a primary output. Because many fault lists on non-sensitive paths are erased, a large unnecessary computing expense is incurred.

In this connection, reference is made to the publication of Lei Wu, D. M. H. Walker: A Fast Algorithm for Critical Path Tracing in VLSI Digital circuits, IEEE, 2005, and the publication of P. Menon, Y. Levendel, M. Abramovici: SCRIPT: A Critical Path Tracing Algorithm for Synchronous Sequential Circuits, IEEE, 1991.

SUMMARY

In accordance with an example embodiment of the present invention, a method is described for determining the fault observability in an electronic circuit. In this method, for each element, in particular for each storage element, the time periods are determined in which an occurrent fault could cause a deviation in a freely selected set of circuit signals. This freely selected set of circuit signals represents the reference set for the fault observability factors that are to be determined, and hereinafter is referred to as the set of analysis output signals. This set can be made up of arbitrary primary output signals, but also of arbitrary internal signals, of which it is assumed that these are fully observable.

With the present method, it is possible, inter alia, to precisely determine fault masking factors for, for example, storage elements in electronic circuits, in particular in digital semiconductor circuits. The observed faults result for example due to single-event upsets (SEU). In order to acquire the masking effects in a semiconductor circuit as precisely as possible, it is necessary to take into account all previously known effects simultaneously. Each effect can indeed be detected individually by conventional methods. However, the unification of all these results yields faults, because the results are not completely independent of one another. In addition, complex masking effects such as FDD and TDD cannot be taken into account, or can be taken into account only with difficulty. Conventional methods, in contrast, are limited even in their application purely to CPU registers, so that they do not permit general inferences concerning synchronous semiconductor circuits.

In addition, the method can be used to determine the set of testable faults (stuck-at fault model) for a given test pattern set.

Alternatively or in addition, it is possible to determine the fault coverage of test patterns.

The presented method takes into account, in a simple manner, as many as possible of the conventional masking effects, and does not use treatment of special cases in the realization of the method. The method makes it possible to take into account the FDD and TDD effects. Compared to the determination of masking factors using Monte Carlo simulation or fault injection, the computing expense is greatly reduced. In addition, the method operates deterministically; no correlation is used for the determination of masking factors over one or more storage elements (e.g., CPU pipeline stages). It is to be noted that the results of the analysis are valid only with application of the single-fault model; i.e., it is assumed that it is always the case that only one fault occurs at a time in a circuit, or that the occurrent faults are functionally independent of one another.

The carrying out of the method can be divided in principle into two steps, the first step acting as preparation for the second step. If the behavior of the circuit is already known, i.e., value progressions from an arbitrary source are already present, it is possible to skip the first step of the method.

In the first step, the behavior of the circuit is modeled using a simulation model and a circuit simulator. The simulation model should have a structure that is as similar as possible to the real hardware with regard to the storage elements and their logical connections. In the simulation step, it is not necessary to simulate the temporal delay behavior of the individual gates; the influence of the gate delay can be included later, in the analysis step, without loss of precision. Standardly, no behavior model is used, because the results of the method would otherwise not have reliable informative value. In particular, models on the register-transfer plane are suitable, because they correctly represent the digital behavior of the circuit, and at the same time are very close to the physical implementation of the circuit.

The primary inputs of the circuit are stimulated, e.g., using a test pattern set (test bench). The carrying out of the simulation does not differ from a standard circuit simulation. During the simulation, typically the value progressions (time and value) and the waveform of all internal signals are recorded, so that their progression can be retrieved. The omission of the delay times in the simulation step leads as a rule to smaller waveform data files, and reduces the execution time of the following steps.

In the second part of the method, for each storage element the time periods are determined in which an SEU could cause a deviation in the analysis outputs, i.e., a fault becomes visible at an analysis output of the circuit.

A representation of the circuit, e.g., a directed graph or a simulation model, can be used to represent the structure and function of the circuit. The circuit state in this representation, i.e., the values of the nodes (signals) and of the storage elements, are now produced in a temporally reversed sequence, using the stored waveform. Beginning from the end of the recording of the waveform to the beginning of the recording, the values are fed into the representation.

For each time at which a change of the state of the representation of the circuit takes place, the processes triggered by the change must be determined. For the storage elements, this means that it must be checked whether input signals are present that, according to the function of the storage element, could cause a renewal or change of the stored value and/or of the output signal. However, here it must be mentioned that in edge-controlled modules, such as registers, an inversion of the sensitive edge direction occurs when the simulation is carried out in the backward direction.

Whenever such a renewal or change in a storage element occurs, this is referred to as a write event. In a write event, all input signals of the storage element named in further drains are read. The time of occurrence of a write event, i.e., the so-called write event time, is important for the further evaluation.

If no delay times were taken into account in the simulation step, then at this point the write event time must additionally be modified with the delay time of the triggering signal in order to obtain correct analysis results in the sense of the present invention. Using the structure contained in the representation of the circuit, it is now possible to trace all input signals of storage elements having write events back to their sources. All storage elements and the primary inputs of the circuit are regarded as sources, but purely combinatorially operating functions (logic gates) are not regarded as sources.

Through the logic gates, with the aid of the laws of Boolean algebra, and using the current state, the sensitive path from the sources to the drains can be determined. This evaluation is however carried out only on the basis of storage elements at which a write event has just occurred. Each storage element, or its stored information, is regarded as sensitive if it is at the beginning of a sensitive path. The storage elements and their stored information not situated at the beginning of a sensitive path are regarded as not sensitive because they do not have any influence on the values of the input signals or drains.

Each storage element receives a variable or marking, referred to hereinafter as a relevance marking. This marking states whether, in the case of a fault, the currently stored information could cause a visible fault at an analysis output and thus in an analysis output signal (positive marking), or whether no fault would be observable (negative marking).

If a write event now occurs at a storage element and this storage element has a positive relevance marking, then a read event is generated at all storage elements at the beginning of sensitive paths. This means that the value stored there was used by subsequent circuit parts. If a read event is generated at a storage element, it receives a positive relevance marking. Additionally, the time of the read event is stored there. If a positive marking is already present there, it remains there. The relevance marking is erased when there is a write event, i.e., a negative relevance marking is set.

If a write event occurs at a storage element and if this storage element has a positive relevance marking, so that at least one read event with its associated time has also occurred, then the read and write event time determine a sensitive time period in which the storage element contains an item of information that, in the case of a fault, would have a visible effect on an analysis output signal. Through summation of all sensitive time periods, an overall sensitive time can be determined for this storage element. This sum, in relation to the overall time period simulated at the beginning, can be interpreted as the derating factor.

The example method as described above can also be used, with very small expansions, to carry out so-called fault grading. In the tracing of the critical paths, the testable faults can easily be determined. All signals on critical paths that go out from primary outputs or registers having positive relevance marking are also observable by the analysis output signals. Therefore, each of these signals on critical paths tests a stuck-at (s-a) fault of the respective inverted present logical level. The difference from previously conventional methods for fault grading lies in the use of the backward simulation. In this way, it is not necessary to propagate fault lists in the forward time direction and, if warranted, to discard them when a path turns out to be non-observable. In the backward simulation, the testable faults can be directly read off, reducing required computing outlay.

If in addition the timing derating is to be taken into account, the time stored when a read event occurs must be modified. The stored time is increased or lowered with regard to its magnitude by the delay time of a signal on the relevant sensitive path, depending on the implementation of the method.

An initial state of the relevance for the end of the simulation time (beginning of the analysis) can be defined for all storage elements of the circuit. Two possible variants are:

Variant 1: all storage elements are relevant, which takes into account the uncertainty concerning the further operation of the circuit at a later time (pessimistic approach). In variant 2, only the analysis outputs of the circuit are relevant. This approach makes sense when the circuit is subsequently no longer used, or if an independent task has been completely processed (optimistic approach). Arbitrary combinations of the two cases are equally possible.

In principle, the circuit simulation can be carried out in the forward direction and/or in the backward direction. Signal progressions from a different source may also be used.

A circuit simulation in the forward direction is understood to be a standard simulation using input stimuli in normal temporal sequence, and unmodified circuit behavior. In this simulation, between two arbitrary storage elements the masking or sensitivity of individual stored items of information or circuit inputs can be determined if the logic function is known. The masking or sensitivity across storage elements is difficult to determine, because here the sequential behavior plays a role. In particular, the masking effect of a stage on preceding stages is difficult to determine, due to the functional relationships among the data. The circuit state propagates forward in time deterministically.

In the case of a circuit simulation in the backward direction, the circuit is not operated in the usual manner. The circuit states are run through in temporally reversed sequence. Due to the specified function of the circuit, however, in general it is not possible to have the circuit function run backwards solely through input stimuli, or, starting from a circuit state, to determine possible preceding circuit states, because the number of possible circuit states increases explosively with each time step. In backward simulation, therefore, the values of all internal modes (storage elements and gate outputs) are not determined by the circuit itself (simulation), but rather are fed in from outside.

The relevance marking propagates in a circuit opposite the direction of the data flow. Relevance markings are produced at the start of the backward simulation according to a fixed rule. Accordingly, the analysis outputs and thus the analysis output signals are the only source.

A combination of the two methods can compensate the weak points of each individual method. In forward simulation, it is difficult or even impossible to take into account transitive masking effects. On the other hand, the circuit state can easily be determined. In backward simulation, the masking effects can easily be determined, but the determination of the circuit state is difficult. If all internal circuit states are now stored for each time step and, in a second simulation run-through, are fed into the circuit from the outside in reversed sequence, the masking effects can be simply and completely determined for the given test pattern set.

The example method can be applied to all types of storage devices and digital circuits; flip-flops, latches, SRAM blocks, and also DRAM can be taken into account. Differences result only in the functions that monitor the input signals and that generate the write events. In the example method, different numbers of masking effects can easily be taken into account. It is not absolutely necessary to take into account all effects in the analysis. In this way, the results for one or more masking effects that were determined by other methods can subsequently be brought into the overall result without taking an effect into account multiple times. Component-specific variables (delay times, setup times, hold and clock-to-Q times, etc.) can be omitted, with a concomitant loss in the precision of the obtained results. The method therefore need not necessarily take into account all masking effects.

The method itself can be implemented in various ways. In principle, any simulator for digital circuits can be used as a circuit simulator. The analysis functions can be implemented as an independent solution, using a conventional programming language. Alternatively, the programming interfaces to hardware description languages (VHDL→Interface VHPI, Verilog→Interface PLI) or interfaces to standardly used simulators (ModelSim SE→Interface FLI) may be used.

Further advantages and embodiments of the present invention result from the description and the figures.

Of course, the features mentioned above and explained below may be applied not only in the indicated combination, but also in other combinations, or alone, without departing from the scope of the present invention.

BRIEF DESCRIPTION OF THE DRAWINGS

FIG. 3 shows an application of the method in a synchronous circuit.

DETAILED DESCRIPTION OF EXAMPLE EMBODIMENTS

Figure 1:
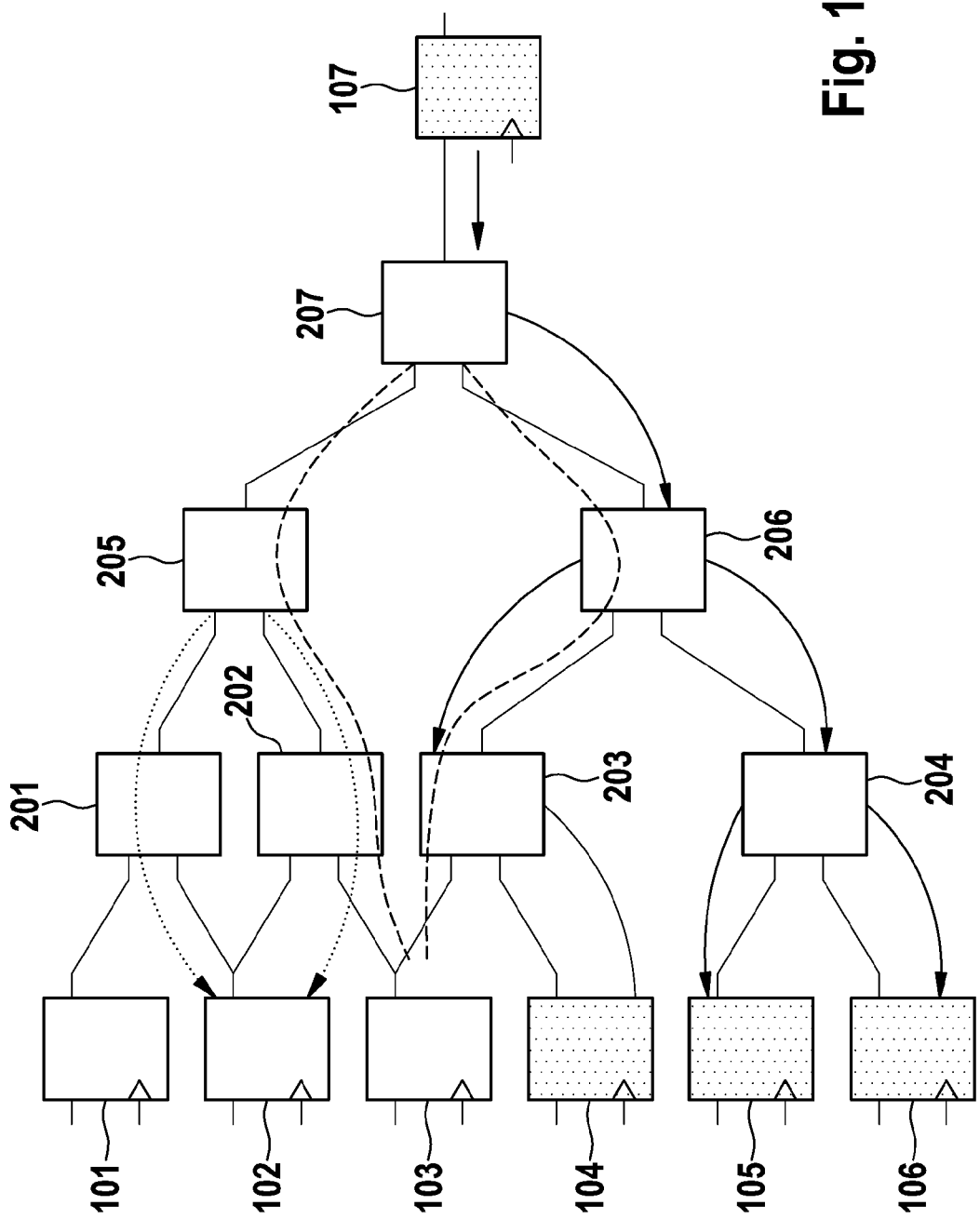
FIG. 1 shows a sensitive path.

The present invention is schematically shown in the drawings on the basis of specific embodiments, and is described in detail with reference to the drawings.

FIG. 1 shows a sensitive path from an input to an output, in which a change of the input signal causes a change in the output signal.

The figure schematically shows how sensitive paths go out from a register, as an example of a storage element. It is assumed that the occupation of registers 101 through 106 by the output signals is such as to bring about the sensitive paths (solid arrows) assumed below. The function of logic blocks 201 through 207 is not specified in more detail.

Going out from register 107, there result sensitive paths via logic gates 207, 206, 203 to register 104, and via 207, 206, 204 to registers 105 and 106. There is no sensitive path to register 101. Registers 102 and 103 are situated in particular structures. Both registers are the beginning of a reconvergent path. Two possible situations are shown. The two paths from 205 via 201 or 202 to 102 (dotted lines) represent the possibility of a multiple-path stimulation. If a fault occurs at 102, due to the reconvergent structure it can cause a multiple fault at 205. Although each individual input of 205 is evaluated as non-sensitive, in the case of a multiple fault this can possibly propagate further to 207.

The two paths (dashed lines) from 207 via gates 202, 203, 205, 206 represent the possibility of a fault self-masking. When a fault occurs at 103, it can propagate via the two depicted paths to 207. Although a fault is present there at a sensitive input, in connection with the faulty second input signal this does not cause any change in the output signal. The fault masks itself.

In order to make it possible to determine the set of testable faults, at this point in the tracing of the sensitive paths going out from a register having a positive relevance marking, additional functionality must be carried out in the analysis. The level of each signal that is part of this sensitive path must be read out. Because this examined signal is part of a sensitive path, and the register at the end of the combinatorial path has a positive relevance marking, the present logic level of the signal is observable at a primary output. Therefore, one stuck-at fault is testable per signal on a sensitive path, assuming a faulty signal level corresponding to the inverted present signal level.

In the case of a testable fault not already found, an entry is added to a global fault list.

Figure 2:
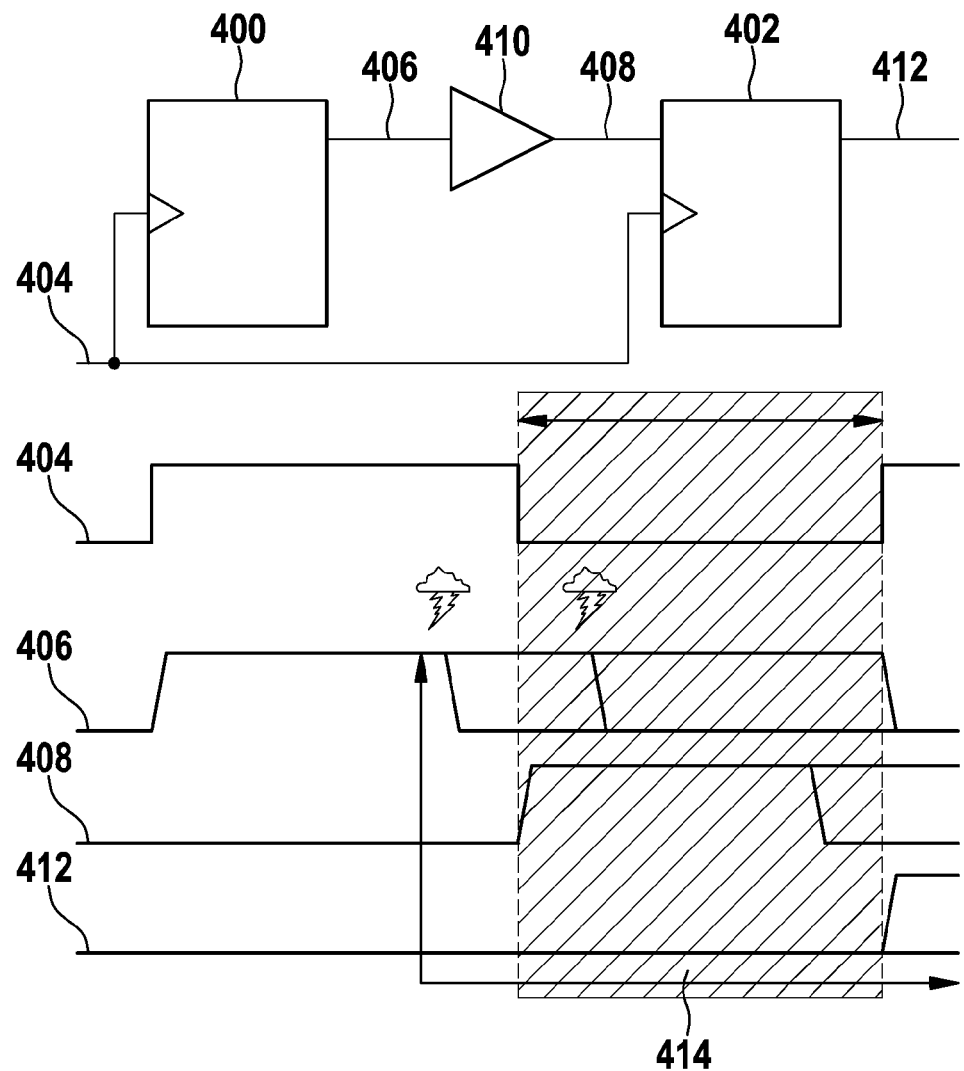
FIG. 2 shows signal progressions illustrating slack.

FIG. 2 shows signal progressions. These illustrate that the slack relative to the clock period can be regarded as the timing derating factor.

Shown are two storage elements, or registers 400 and 402, that need not necessarily be triggered by the same signal. In this case, a common clock signal CLK 404 is used. Shown are the progressions of analysis output signal S1 406 at the output of first register 400, of analysis output signal S2 408 after a delay element 410, and of analysis output signal S3 412 at the output of second register 402.

In general, the temporal difference between associated trigger time points (tDiff) of the two elements is used. The signal runtime between the two elements now determines, together with tDiff, the remaining time period in which a fault must occur at the preceding element so that it can propagate to further parts of the circuit. The remaining time period is designated slack. The ratio of slack to tDiff can be interpreted as the timing derating factor.

Shown in hatching is a masking window 414. Faults that occur outside the masking window can be recognized at the output.

FIG. 3 shows an example of an application of the method to a synchronous circuit. Here, functions of blocks 200 through 204 are not further defined. However, it is to be assumed that an occupation of the input values of each function block is present, resulting in the sensitive paths (marked continuously in bold) assumed as examples.

Beginning from the circuit outputs at registers 108 and 109, regarded as relevant at this time, an inference can be drawn concerning the relevance of the registers of the preceding stage. From register 108, there exists a path to register 104 (via connection 310 and 315), and to register 105 (via connection 311 and 315), through logic element 203. From register 109, there exist paths to register 105 (via connection 312 and 316), register 106 (via connection 313 and 316), and register 107 (via connection 314 and 316) through logic element 204.

It is assumed that at a time tClk*(n−1), registers 104, 105, 106, 107 have stored values that bring about sensitive paths to output registers 108 and 109. Based on the logic function of logic element 204 and of the circuit state, there does not result a sensitive path from register 106 to register 109. The value of register 106 therefore has no influence on the circuit output. From register 105, two sensitive paths go out. However, it is not therefore more sensitive than other registers. An outgoing sensitive path is sufficient to mark the register as relevant.

Going out from registers 100 through 103, there exist paths 300 through 309 through logic elements 200 through 202, going to registers 104 through 107. It is now assumed that at time t tClk*(n−2), registers 100 through 103 have stored values that result in sensitive paths to registers 104, 105, 107. Since there exists no sensitive path from register 102 via 305 through logic element 202 via 309 to register 107, and the path from register 102 via 304 through logic element 201 via 308 to register 106 is indeed sensitive, but register 106 is not marked as relevant, register 102 also does not receive a relevance marking. Sensitive paths may indeed run to register 106 (marked as not relevant), but the relevance does not propagate via these paths.

If the fault masking is regarded only in the forward direction, in this example register 102 would erroneously be regarded as relevant, because the information from later times is missing.

For the circuit that is to be analyzed, at the beginning of the analysis a graph structure is created. This digital semiconductor circuit is represented by a directed graph G.

$$G=(N, V, N \times V)$$

The set of nodes N is made up of the union of four subsets.
Set of registers R (registers)
Set of circuit functions with combinatorial behavior L (logic)
Set of signals produced without input signal (e.g. constants, specifically HW signals) I (independent)
Set of inputs and outputs of the circuit E (environment)

$$N=R \cup L \cup I \cup E$$

Each node from the set N corresponds to an object containing the information concerning linkages with other nodes/objects. In addition to this linkage information, these objects contain variables and lists having information concerning the access to this object (in its function as logic block or register).

The analysis of the behavior of the circuit takes place during the backward simulation. Separate processes are produced that recognize particular symbol combinations at the register inputs. When a fitting state is recognized, as a consequence the analysis functions for the relevant object are called. The analysis is divided into two parts, the part for the information sources and the part for the information drain.

As the first part, a function is executed for the triggering register. The current simulation time is used as the time for a write access to this register. If no delay times were used in the generation of the stimulation data, the influence of the delay at this point can be taken into account by modifying the time of the write access. In backward simulation, the sequence in principle of write and read access to a register is exchanged, i.e., the register content is first read or consumed before it is written or produced. A read access to a register content can take place multiple times, while the write access takes place only once, and in the backward simulation the write access terminates the lifespan of the register content. When a write access takes place, the relevant time of this register is increased by the difference between the time of the read access situated furthest back in time therefrom and the time of the write access. All read accesses already situated in the past are no longer taken into account in subsequent write accesses. If no read access exists for a write access, the relevant time is also not increased. If at least one read access exists for a write access, the register content is regarded as relevant.

In the analysis phase, the circuit delays can also enter purely computationally into the analysis result. There are thus two variants:

Simulation with delays, analysis with delays;
Simulation without delays, computational integration of the delays during analysis.

The two variants supply exactly the same results, but the second variant offers advantages with regard to execution speed and the simulation data file size.

Figure 4A:
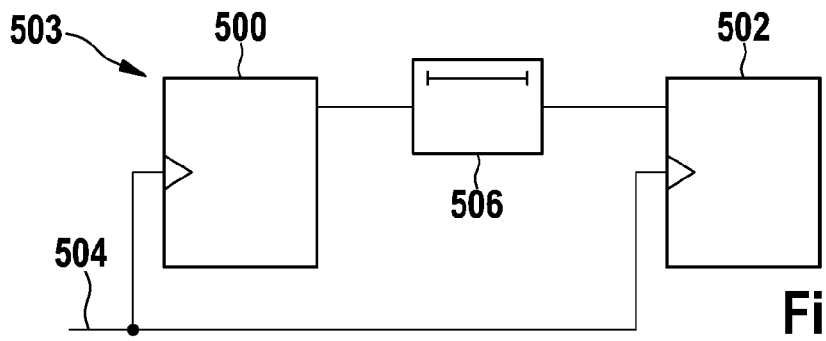
FIG. 4 shows a simulation in the forward and backward direction.
Figure 4B:
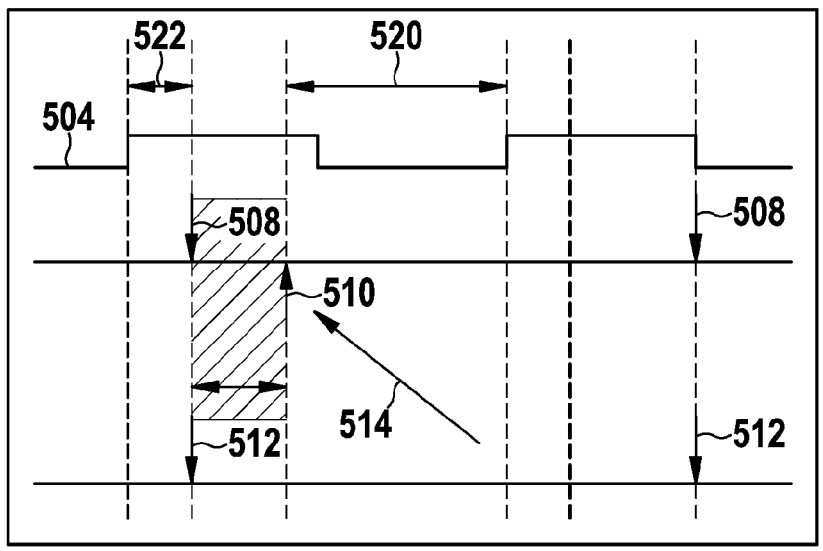
Figure 4C:
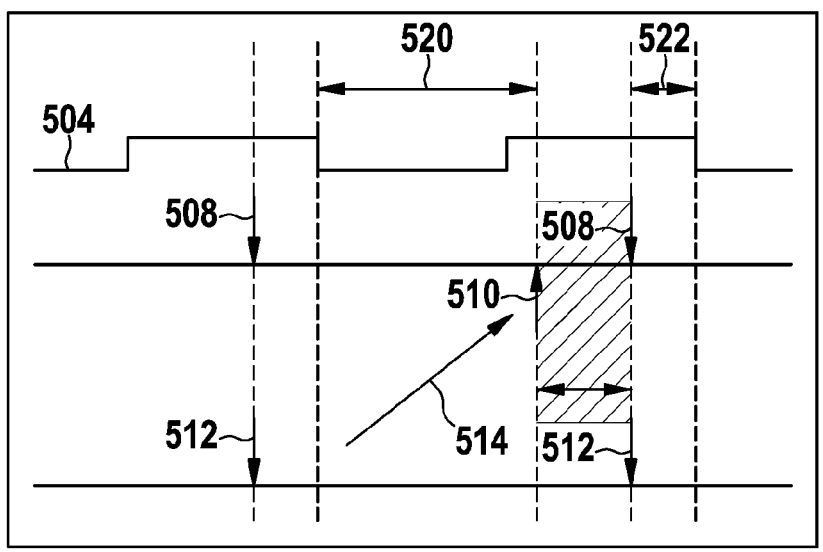

FIG. 4 shows a simulation in the forward direction (FIG. 4b) and in the backward direction (FIG. 4c).

FIG. 4 schematically shows the relationships between write and read accesses to two storage elements, or registers 500 and 502, of an electronic circuit 503. In addition, a delay element 506 is provided.

Shown is a not necessarily common clock signal CLK 504, the trigger times resulting therefrom for the preceding register 500 (center line, downward-pointing arrows 508 for write events, upward-pointing arrows 510 for read events), and the following register 502 (lower line, downward-pointing arrows 512 for write events, upward-pointing arrows 514 for read events), which also need not necessarily be simultaneous.

The shifting of the write event time of preceding register 500 relative to the time of the clock edge takes into account design-related variables of the register (setup time, hold time, clock-to-Q time, . . . ) as well as a lack of influence of delay times in the simulation phase. This is combined in shift 522. The shifting of the read event time relative to the time of the clock edge likewise takes into account design-related variables of the register, as well as the delay time of other gates and lines situated between the registers. The size of the shift is not connected to a direction/prefixed sign; it may take place both in the positive and in the negative direction. FIG. 4b shows the conditions in a forward simulation; FIG. 4c shows the conditions in a backward simulation. The shift of the read event time, inter alia due to delay element 506, is illustrated by double arrow 520.

In the second part, the sensitive paths and the source registers are determined. Going out from the register that triggered the analysis, the preceding logic blocks and registers are investigated with the linkage information. However, this takes place only if the register content is regarded as relevant (transitive effect). Non-relevant register contents result in a complete masking of the driving registers. Given relevant register content, the write event time is used as the read event time and is forwarded as a parameter to the objects to be investigated. Two cases are to be treated, in a recursive schema:

If the preceding object is a register, then this path is traced completely back to its source. The recursion ends here for this path. In the register, the time of this read access is stored for further processing.

If the preceding object is a combinatorial block, this path is not yet fully investigated. As a function of the input signals and the logic function of this plot, the further progression of the sensitive paths can be determined by the circuit. Here reference is made to fault masking by a logic function. The objects that are the immediate predecessors on the sensitive paths must also be investigated in the following analysis steps. The sensitive paths are further traced, and the read event time is increased by the delay of the lines and the runtime of the logic function of the block currently being examined, and is forwarded as a modified parameter.

This process is repeated until all source registers of sensitive paths have been found.

The time behavior of the circuit has a large influence on the results of the analysis. In order to take timing derating into account, delay values are required for each object. These delay values are normally taken from a library, or produced by a static timing analysis. In the production of the graph structure for the analysis of the circuit, these timing parameters are read out and assigned to the respective linkages to other objects.

During the simulation, if a preceding object is investigated, the delay of this specific path must be taken into account in order to correspondingly modify the time of the read access, comparable to the timing derating.

The existing signal progressions of the circuit from a forward simulation or other sources can be brought into the representation of the circuit in temporally reversed sequence. However, the temporal distances between the individual signal value changes remain unchanged. The signal values of internal nodes are occupied with the previously recorded signal values.

The existing processes of the analysis functionality, however, continue to operate in the standard manner. Thus, if corresponding conditions are met (input signal combinations), the processes are triggered that are responsible for the analysis.

The only process that has to be actively carried out by the analysis method is the continuing stimulation of the circuit with the recorded values. The activation of the analysis processes is brought about indirectly by changing the stimulated signals; here edge-controlled processes have to react to the respectively opposed edge. Here reference is made to FIG. 4, in which for example the register triggers on pos. clock edge→in the backward simulation the analysis process triggers on the neg. clock edge. The stimulation is carried out until the beginning of the recorded values is reached.

In order to determine the portion of the relevant time of a register output, all write accesses must be evaluated during the simulation. The sum of the differences of corresponding write and read accesses forms the overall relevant time.

In the circuit simulation, it can occur that a plurality of write accesses to different registers occur at exactly the same time. Due to the sequential structure of the analysis software, the analysis functions are executed in a sequence that is not necessarily defined. However, this sequence has no effect on the analysis result. The time at which read events are generated (by a subsequent register) is in each case earlier than the generation of the write event of this register (standardly approximately 1 clock period, in circuits having a clock signal). In the case of a write event, only the read events situated in the past are taken into account. Due to the undefined sequence, read events can also be entered at a register that are already in the future (due to read event tRead−Event=tNow+tDelay>tNow), i.e., are to be used in the evaluation of the next write event.

In order to achieve a correct analysis result, a correctly functioning circuit in the sense of the static timing analysis is presupposed.

The carrying out of the example method supplies an evaluation of the sensitivity individually for each register of the circuit. Due to the properties of this method, transitive masking effects can be taken into account over arbitrarily many register stages.

The simplest evaluation takes place through the ratio of the relevant time to the overall simulation time. This ratio reflects the portion of temporally equally distributed occurrent faults that become visible at analysis outputs, taking into account the overall function of the circuit.

In addition, a statistic can be created concerning the frequency and duration of the sensitive time periods of this register. This can be used to select possibly suitable measures for reducing the fault rate.

The analysis can in principle analyze any possible digital synchronous circuit. For this purpose, a representative test pattern set is required. Standardly, this is a typical case of application of the circuit. The analysis is based on the assumption of the single-fault model, i.e., no effects of multiple temporally and spatially adjacent faults are examined.

This single-fault assumption stands in conflict with reconvergent circuit structures. All faults that occur before or at the starting point of a reconvergent circuit part may be expressed as multiple false signals at the convergence point. In the determination of the masked paths, however, only single faults, or independent signals, are assumed.

Through the use and generation of finely differentiated relevance markings, i.e., there exist the stages "relevant," "not relevant," "suspected self-masking," and "suspected multiple path stimulation," together with an identification of the convergence point in reconvergent circuit parts, it is possible to take into account the effects of reconvergent structures.

However, an additional precondition is a temporal co-occurrence of the signals of the reconvergent path. In synchronous circuits, for example a different number of register stages on the different paths of the reconvergent circuit part can prevent a co-occurrence of dependent items of information at the reconvergence point. A fault in the analysis occurs only if dependent items of information are processed at the same time at the reconvergence point.

In backward simulation and analysis, the fault masking is traced from analysis outputs of the circuit to the input of the circuit. At a logic block that represents the convergence point of the reconvergent path, the masked paths are calculated. The input signals of this logic block, stemming from the reconvergent path, can be regarded both as relevant and as irrelevant. On the signal paths regarded as not relevant, no relevance marking is propagated in the direction of the starting point of the reconvergent path. At this starting point, all incoming relevance markings are now collected (logical OR), and if no markings come in, the circuit part before the starting point of the reconvergence is also regarded as not relevant. Beginning from this starting point of the circuit, the analysis results are not necessarily correct in the sense of the analysis.

Figure 5:
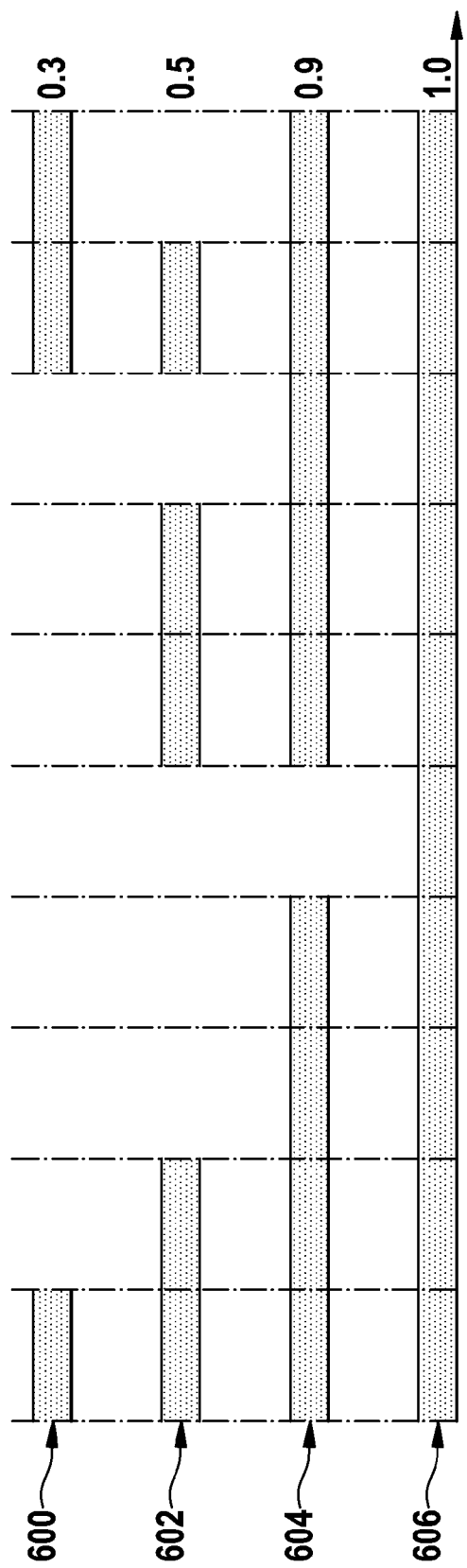
FIG. 5 shows a temporally weighted sum.

FIG. 5 shows a temporally weighted sum.

The fault masking factor is a statistical mean value expressing what portion of faults results in visible changes in the system output. However, fault masking itself is discrete in nature, i.e., the faults are either suppressed or not. It is therefore obvious to perform a conversion of a sequence of time periods having discrete values (1 or 0, fault masking active or not) into a continuous value by using a temporally weighted sum (integral of the fault masking over time). This is consistent with the assumption of occurrent faults that are equally distributed in time. The resulting fault masking factor is calculated from the sum of the lengths of all sensitive time periods relative to the overall time under consideration. In FIG. 5, as an example four progressions 600, 602, 604, and 606 of sensitive time periods (hatched box) of different signals are shown. Resulting fault masking factors are indicated in each case at the right, next to the depicted progressions of the sensitive time periods.

The presented method can be used in software tools that are used to examine the functional reliability of electronic circuits. With this tool, in principle all digital electronic circuits can be examined. The obtained results can be used to detect reliability in security-relevant systems. It is to be noted that in complex systems such automated methods are helpful, and enable examination with a high degree of precision of detail.

The results of the example method can also be used to improve the examined circuit. A system still in the development phase can be examined for weak spots with regard to susceptibility to faults. If warranted, these weak spots can be avoided through design modifications.

If the example method is used to determine test coverage, the global fault list then contains all testable faults for the test pattern set under consideration, after conclusion of the method. All testable faults can be taken directly therefrom, and the set of non-testable faults is the complementary set relative to the total possible set of faults of the circuit under examination.

What is claimed is:

1. A method for determining an observability of faults in an electronic circuit, comprising:
   simulating, by a computer processor and in a first step, which is in a simulation phase, a behavior of the electronic circuit using a simulation model; and
   determining, by the processor in a second step, which is in an analysis phase, based on the simulating, and for each of a plurality of elements of the electronic circuit, time periods in which an occurrent fault could cause a deviation in analysis output signals, the occurrent fault determined not to cause any deviation in output signals in other time periods.

2. The method as recited in claim 1, wherein in the simulation phase, delays are used that are taken into account in the analysis phase.

3. The method as recited in claim 1, wherein in the simulation phase, no delays are used, and in the analysis phase, a computational integration of the delays takes place.

4. The method as recited in claim 1, wherein the simulating is carried out in a forward direction.

5. The method as recited in claim 1, wherein the simulating is carried out in a backward direction.

6. The method as recited in claim 1, wherein an initial state of the relevance for an end of a simulation time is determined for all of the elements.

7. The method as recited in claim 1, wherein the method is used to determine fault masking factors for the elements in the electronic circuit.

8. The method as recited in claim 1, wherein the method is used to determine fault coverage of test patterns.

9. A system for determining an observability of faults in an electronic circuit, the system comprising:
   a computer processor configured to:
      simulate a behavior of the electronic circuit using a simulation model; and
      determine, for each of a plurality of elements of the electronic circuit and based on the simulation, time periods in which an occurrent fault could cause a deviation in analysis output signals, the occurrent fault determined not to cause any deviation in output signals in other time periods.

* * * * *